US010886215B2

(12) United States Patent
Zahedmanesh et al.

(10) Patent No.: US 10,886,215 B2
(45) Date of Patent: Jan. 5, 2021

(54) INTERCONNECT STRUCTURE AND RELATED METHODS

(71) Applicant: IMEC VZW, Leuven (BE)

(72) Inventors: Houman Zahedmanesh, Heverlee (BE); Victoria L. Calero Diaz Del Castillo, New York, NY (US); Christian Witt, Overijse (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/521,127

(22) Filed: Jul. 24, 2019

(65) Prior Publication Data

US 2020/0105667 A1    Apr. 2, 2020

(30) Foreign Application Priority Data

Sep. 28, 2018 (EP) .................................. 18197400

(51) Int. Cl.
| *H01L 23/52* | (2006.01) |
| *H01L 23/522* | (2006.01) |
| *H01L 21/768* | (2006.01) |
| *H01L 23/528* | (2006.01) |
| *H01L 23/532* | (2006.01) |

(52) U.S. Cl.
CPC .... *H01L 23/5226* (2013.01); *H01L 21/76816* (2013.01); *H01L 23/5283* (2013.01); *H01L 23/53295* (2013.01)

(58) Field of Classification Search
CPC ........... H01L 23/5226; H01L 21/76816; H01L 23/5283; H01L 23/53295
See application file for complete search history.

(56) References Cited

U.S. PATENT DOCUMENTS

| 10,020,255 B1 | 7/2018 | Bao et al. |
| 2005/0280120 A1 | 12/2005 | Tomita |
| 2008/0230874 A1 | 9/2008 | Yamada et al. |
| 2011/0115073 A1 | 5/2011 | Chen |
| 2011/0193197 A1 | 8/2011 | Farooq et al. |
| 2013/0075920 A1 | 3/2013 | Chen et al. |
| 2018/0047676 A1 | 2/2018 | Briggs et al. |

OTHER PUBLICATIONS

European Search Report, European Patent Application No. 18197400.7, dated Mar. 15, 2019, 5 pages.

*Primary Examiner* — Victor A Mandala
*Assistant Examiner* — Colleen E Snow
(74) *Attorney, Agent, or Firm* — McDonnell Boehnen Hulbert & Berghoff LLP

(57) ABSTRACT

Example embodiments relate to interconnect structures and related methods. One embodiment includes an interconnect structure. The interconnect structure includes a first interconnection level including a first dielectric layer and a first set of conductive paths. The interconnect structure also includes a second interconnection level arranged above the first interconnection level and including a second dielectric layer and a second set of conductive paths. Further, the interconnect structure includes a third interconnection level arranged above the second interconnection level and including a third dielectric layer and a third set of conductive paths. In addition, the interconnect structure includes a fourth interconnection level arranged above the third interconnection level and including a fourth dielectric layer and a fourth set of conductive paths. Still further, the interconnect structure includes a first multi-level via structure and a second multi-level via structure.

18 Claims, 2 Drawing Sheets

INTERCONNECT STRUCTURE AND RELATED METHODS

CROSS-REFERENCE TO RELATED APPLICATIONS

The present application is a non-provisional patent application claiming priority to European Patent Application No. EP 18197400.7, filed Sep. 28, 2018, the contents of which are hereby incorporated by reference.

FIELD OF THE DISCLOSURE

The present disclosure relates to integrated circuit processing. In particular, the present disclosure relates to an interconnect structure, and to a method for forming a first multi-level via structure and a second multi-level via structure in such an interconnect structure.

BACKGROUND

Generally, the introduction of low-k type materials in the back-end-of line (BEOL) and middle-end-of line (MOL), and the industry transition from lead-based solder bumps to lead-free technology, has caused multiple difficulties in chip-package interactions (CPI), such as stress driven failure upon chip-package joining or dicing of the substrate wafer.

To overcome these difficulties, careful mechanical engineering is necessary to create design details such as crack-stop guard rings around each die which help to protect the active chip circuitry from cracks propagating during dicing. Another aspect is the mechanical integrity around interior features such as bond pads. These areas may undergo significant stresses during chip-substrate joining using solder bumps.

In view of the above, there is a need for improved crack-stop designs.

SUMMARY

According to a first aspect of the present disclosure, there is provided an interconnect structure, comprising: a first interconnection level including a first dielectric layer and a first set of conductive paths; a second interconnection level arranged above the first interconnection level and including a second dielectric layer and a second set of conductive paths; a third interconnection level arranged above the second interconnection level and including a third dielectric layer and a third set of conductive paths; and a fourth interconnection level arranged above the third interconnection level and including a fourth dielectric layer and a fourth set of conductive paths; the interconnect structure further comprising: a first multi-level via structure extending from the first interconnection level to the third interconnection level and forming a single unitary body passing through the second interconnection level distant from any of the second set of conductive paths; and a second multi-level via structure extending from the second interconnection level to the fourth interconnection level and forming a single unitary body passing through the third interconnection level distant from any of the third set of conductive paths.

The disclosure is based on the realization that conventional via interconnect layers may provide the least strength or fracture toughness in integrated circuits. Both via density and lateral distribution has been found to be effective in increasing the overall toughness of the BEOL or MOL layer stack. However, in advanced logic technology nodes such as 5 nm or 3 nm, the available area for via/interconnect routing is becoming exceedingly scarce. For this reason, multilevel vias, or supervias have been proposed. As opposed to regular vias that extend from one metal layer to the next upwards or downwards, the multi-level via structures may span two or more metal levels. It is further envisioned that the multi-level via structures may be implemented primarily to increase resistance to cracking and/or delamination, and thus the multi-level via structures need not necessarily be a routing feature for electrically connecting metal layers.

The interconnect structure may reduce the risk of cracking or cracking propagation between the interfaces of the multi-level via structures and the interconnection levels, and/or between the interfaces of interconnection levels bridged by the multi-level via structures. In particular, the interconnect structure may reduce the risk of cracks propagating horizontally, i.e. in a direction parallel to a main plane of extension of the interconnection levels. Further, the interconnect structure may bridge vulnerable layers which are at a high risk of fracture. This effect may be enhanced by arranging the first multi-level via structure and the second multi-level via structure in a staggered overlapping arrangement. Such a staggered overlapping arrangement will be further discussed throughout the present disclosure.

The multi-level via structures being "a single unitary body" may reduce the number of interfaces within the multi-level via structure as compared to conventional via-connection structures stacked upon each other. In particular, the number of substantially horizontal interfaces may be reduced. The single unitary body may be achieved by forming the multi-level via structure in one set of steps (e.g. masking, etching and depositing), and may be contrasted to a set of conventional vias that are stapled on top of each other as subsequent layers are being formed and processed.

So as not to obscure the present disclosure with details that will be readily apparent, specific steps of masking, etching, and depositing will not be described. The person skilled in the art is capable, guided by the present disclosure, to form the interconnect structure according to the disclosure using conventional integrated circuit processing techniques.

A "multi-level via structure" is a via which directly interconnects two non-adjacent interconnection levels and bypasses an intermediate level. Although the multi-level via structure need not necessarily electrically connect two non-adjacent interconnection levels, it may be noted that the multi-level via structure may electrically bypass an intermediate level. The multi-level via structures may be referred to as "multilayer vias" or "supervias" since they have a physical extension exceeding the separation between two adjacent interconnection levels.

The first multi-level via structure may extend directly between the set of conductive paths of the first and the third interconnection level, thereby electrically bypassing the set of conductive paths of the second interconnection level. More specifically, the first multi-level via structure may extend to physically and electrically by-pass all horizontal conductive lines of the second interconnection level.

Similarly, the second multi-level via structure may extend directly between the set of conductive paths of the second and the fourth interconnection level, thereby electrically bypassing the set of conductive paths of the third interconnection level. More specifically, the second multi-level via structure may extend to physically and electrically by-pass all horizontal conductive lines of the third interconnection level.

The denomination "multi-level" via structure reflects that spans over two non-adjacent interconnection levels and bypasses an intermediate interconnection level. In contrast, a conventional "single-level" via, is arranged within only a single interconnection level.

By "interconnection level" is hereby meant a level, or a tier, of an interconnect structure. First through third interconnection levels may form consecutive levels of an interconnect structure. In other words, the second interconnection level may be formed directly on the first interconnection level and the third interconnection level may be formed directly on the second interconnection level. However, there may exist additional interconnection levels between e.g. the first and second interconnection levels, or between the second and third interconnection levels, and so forth. It should further be noted that the first interconnection level need not necessarily be a lower most interconnection level of the interconnect structure but one or more further interconnection levels may be present below the first interconnection level.

Each interconnection level includes a set of conductive paths or structures. A set of conductive paths may include a set of horizontal conductive paths, lines or traces arranged in a common horizontal plane. In other words, a set of conductive paths may form horizontally extending interconnections of an interconnection level. The set of conductive paths of each interconnection level may be arranged to provide a horizontal routing of (electrical) signals, i.e. a routing within the common horizontal plane. The conductive paths may be formed of a metal (e.g. a single metal or a combination of two or more different metals).

By "dielectric layer" (such as the first, second, third, and fourth dielectric layer) is hereby meant any layer including a material or a combination of materials such that the layer may act as an electrical isolator. A dielectric layer may be formed as a single material layer, or as a stack of sub-layers formed of different materials. The dielectric layer may include vias. The dielectric layer may include via-connection structures. Such via-connection structures may extend vertically between an upper interconnection level and a lower interconnection level.

As used herein, the term "horizontal" in relation to a plane or a direction denotes a direction or plane being parallel to a main plane of extension of any of the interconnection levels. The interconnect structure may be supported by a substrate wherein the term "horizontal" direction or "horizontal" plane equivalently may be understood as a direction parallel to a main plane of extension or a main surface of the substrate. Further, the term "horizontal" may denote a direction parallel to a main plane of extension of any of interconnection levels.

As used herein, the term "vertical" in relation to a direction or plane denotes a direction or plane being perpendicular to a horizontal direction or horizontal plane. I.e. the term "vertical" direction or "vertical plane" denotes a direction or plane being perpendicular to a main plane of extension of any of the interconnection levels, or to (a main surface of) a substrate supporting the interconnect structure. Further, the term "vertical" may denote a direction parallel to a main plane of extension of any of interconnection levels Accordingly, the terms "above" or "upwards" and "below" or "downwards" refer to directions along the vertical direction and opposite to the vertical direction, respectively.

By a first feature such as a layer, a level or other structure, being formed "on" a second feature such as a layer, a level or other structure, is hereby meant that the first feature may be formed directly on the second feature, i.e. in abutment with the second feature, or with one or more layers or structures intermediate the first and the second feature, i.e. not in direct contact with the second feature, unless explicitly stated otherwise.

The term "via" or "via-connection structure" should be understood as any vertically extending interconnection between an upper interconnection level and a lower interconnection level, the via having a lower end portion and an upper end portion, the lower end portion abutting or terminating on a topmost surface of a set of conductive paths of the lower interconnection level, the upper end portion abutting or terminating on a bottom surface of a set of conductive paths of the upper interconnection level.

The first interconnection level and the second interconnection level may form part of a first group of layers. Further, the third interconnection level and the fourth interconnection level may form part of a second group of layer, wherein an effective out-of-plane elastic modulus elasticity of the first group of layers may differ by at least 15% from an effective out-of-plane elastic modulus of the second group of layers.

The effective out-of-plane elastic modulus of the first group of layers may differ at least 40%, such as at least 50%, from an effective out-of-plane elastic modulus of the second group of layers.

The first group of layers may have a thermal expansion coefficient (TEC) differing from the second group of layers.

In general, the interconnect structure according to the disclosure may provide for increased resistance to cracking in arrangements wherein thermomechanical and/or purely mechanical stress is present.

The following paragraphs will discuss dielectric materials and dielectric constants. A dielectric material having a dielectric constant below a cut-off value may be defined as an ultra low-k (ULK) dielectric material, while a dielectric material having a dielectric constant at or above the cut-off value may be defined as low-k (LK) dielectric material. Several cut-off values are envisioned within the scope of the present disclosure, such as e.g. 3 as explicitly discussed below. Other cut-off values are possible, for example ULK being below 2.6 and LK being at or above 2.6, and ULK being below 2.4 and LK being at or above 2.4.

The first dielectric layer and the second dielectric layer may be formed of a material having a dielectric constant below 3. Further, the third dielectric layer and the fourth dielectric layer may be formed of a material having a dielectric constant of 3 or more.

The first dielectric layer and the second dielectric layer may be formed of a material having a dielectric constant of 3 or more; and the third dielectric layer and the fourth dielectric layer may be formed of a material having a dielectric constant below 3.

It is further envisioned that silicon dioxide may be used in place of LK dielectric materials.

Accordingly, the first dielectric layer and the second dielectric layer may be formed of or include a silicon dioxide, and the third dielectric layer and the fourth dielectric layer may be formed of a material having a dielectric constant below 3.

Further, the first dielectric layer and the second dielectric layer may be formed of a material having a dielectric constant below 3, and the third dielectric layer and the fourth dielectric layer may be formed of or include a silicon dioxide.

ULK dielectric materials are often fragile, and have weak mechanical properties due to their porous structure and chemistry. Therefore, the interconnect structure according to the disclosure may provide for increased strength and reduced risk of cracking when such materials are used.

The following list is a non-exhaustive list of ULK dielectric materials envisioned to be used within the scope of the disclosure: NCS (Nano-clustering silica) 2.3; ALK-A; ALK-AA; ALK-B; ELK 2.3; BDII 2.3; SBA-1.8; NCS-1.8; Sumitomo-2.1; ELK-2.1; Ulvac 2.0; Ulvac 2.2; NCS 2.3; Sumitomo M; Sumitomo V; Hitachi 2.35; NCS 2.0; NCS 2.0; SBA 1.8; SBA2.0; SBA2.2; BDIII 2.2; BDIII 2.4.

The following list is a non-exhaustive list of LK dielectric materials envisioned to be used within the scope of the disclosure: Aurora LK; Aurora LK HM; SiO2.

The interconnect structure may include a plurality of via-connection structures for electrically connecting adjacent interconnection levels of the first, second, third, and fourth interconnection levels, wherein the first multi-level via structure and/or the second multi-level via structure may be arranged in a region in which a density of the via-connection structures is less than 5%.

By density is hereby meant a footprint of the via-connection structures, i.e. a percentage covered by the footprint of the via-connection structures. In particular, the density of the via-connection structures may be a measure of surface area of the via-connection structures in a horizontal plane of the interconnect structure divided by a total surface area in the horizontal plane of the interconnect structure. It is further envisioned that the first multi-level via structure and/or the second multi-level via structure may be arranged in a region in which a density of the via-connection structures is less than 10%, such as less than 2%.

The first multi-level via structure may be connecting the first set of conductive paths to the third set of conductive paths, and the second multi-level via structure may be connecting the second set of conductive paths to the fourth set of conductive paths. Hereby, the first and second multi-level via structure may provide electrical routing within the interconnect structure.

According to a second aspect of the present disclosure, there is provided a method of forming a first multi-level via structure and a second multi-level via structure in an interconnect structure, comprising: forming a first interconnection level including a first dielectric layer and a first set of conductive paths; forming a second interconnection level, including a second dielectric layer and a second set of conductive paths, above the first interconnection level; forming a third interconnection level, including a third dielectric layer and a third set of conductive paths, above the second interconnection level; forming a first multi-level via structure extending from the first interconnection level to the third interconnection level, wherein the first multi-level via structure is formed as a single unitary body passing through the second interconnection level distant from any of the second set of conductive paths; forming a fourth interconnection level, including a fourth dielectric layer and a fourth set of conductive paths, above the third interconnection level; and forming a second multi-level via structure extending from the second interconnection level to the fourth interconnection level, wherein the second multi-level via structure is formed as a single unitary body passing through the third interconnection level distant from any of the third set of conductive paths.

The first multi-level via structure may be connecting the first set of conductive paths to the third set of conductive paths, and wherein the second multi-level via structure is connecting the second set of conductive paths to the fourth set of conductive paths.

According to a third aspect of the disclosure, there is provided a use of an interconnect structure according to the first aspect for improving resistance to crack propagation in a semiconductor device.

Effects and features of the second and third aspect of the present disclosure are largely analogous to those described above in connection with the first aspect of the disclosure. Embodiments mentioned in relation to the first aspect of the present disclosure are largely compatible with the further aspects of the disclosure.

BRIEF DESCRIPTION OF THE DRAWINGS

The above, as well as additional objects and features will be better understood through the following illustrative and non-limiting detailed description, with reference to the appended drawings. In the drawings like reference numerals will be used for like elements unless stated otherwise.

DETAILED DESCRIPTION

Figure 1:
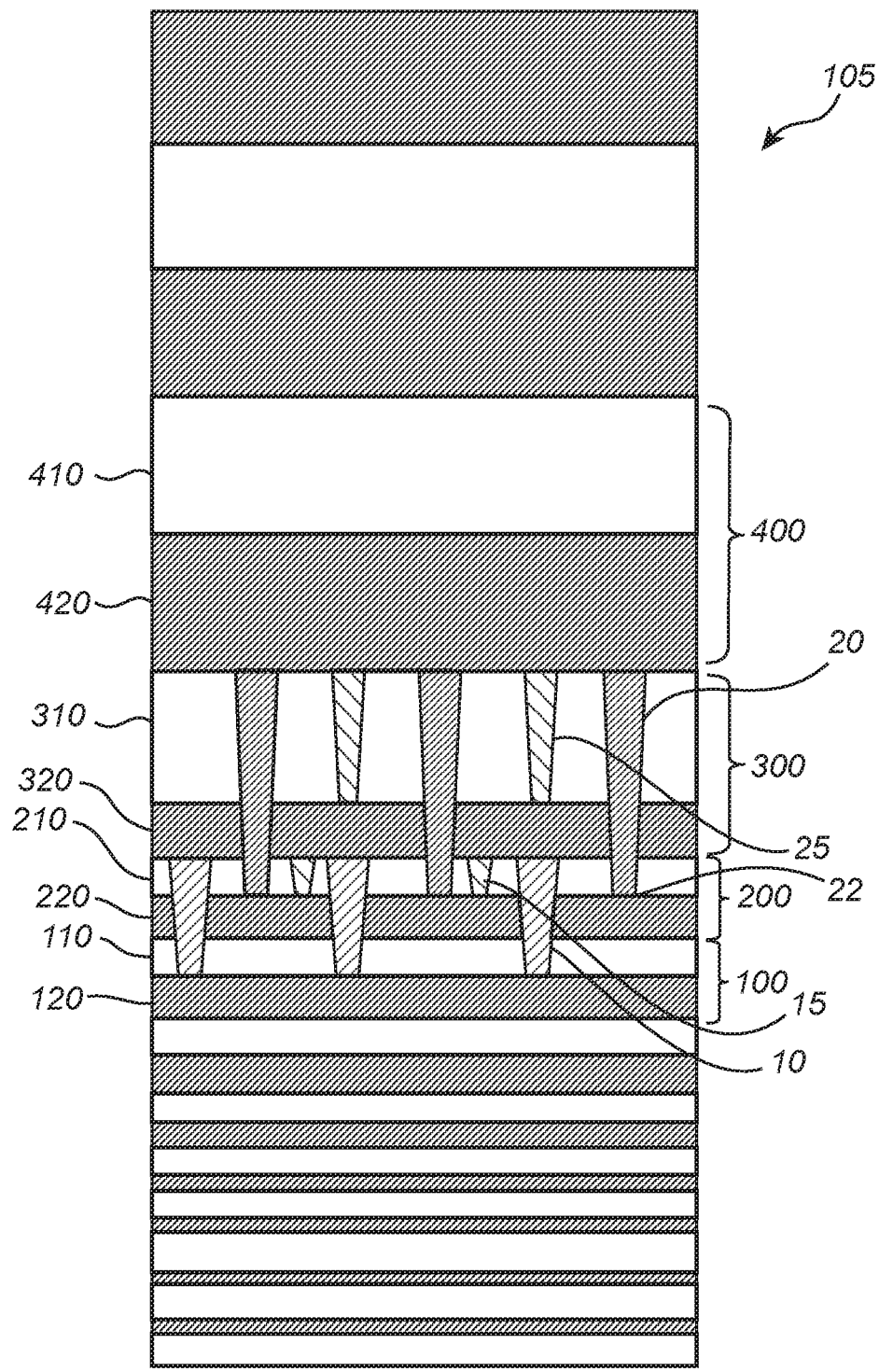
FIG. 1 is a schematic cross-sectional side view of an interconnect structure, according to example embodiments.

FIG. 1 illustrates an interconnect structure 105. It should be noted that the illustrated interconnect structure is merely a schematic representation, and the thicknesses of the illustrated layers and features may not be drawn to scale.

The interconnect structure 105 includes a first interconnection level 100 including a first dielectric layer 110 and a first set of conductive paths 120; a second interconnection level 200 arranged above the first interconnection level and including a second dielectric layer 210 and a second set of conductive paths 220; a third interconnection level 300 arranged above the second interconnection level and including a third dielectric layer 310 and a third set of conductive paths 320; and a fourth interconnection level 400 arranged above the third interconnection level and including a fourth dielectric layer 410 and a fourth set of conductive paths 420.

The interconnect structure further includes a first multi-level via structure 10 extending from the first interconnection level 100 to the third interconnection level 300 and forming a single unitary body passing through the second interconnection level 200 distant from any of the second set of conductive paths; and a second multi-level via structure 20 extending from the second interconnection level 200 to the fourth interconnection level 400 and forming a single unitary body passing through the third interconnection level 300 distant from any of the third set of conductive paths.

As can be seen, the first and second multi-level via structure 10, 20 here extend partly through the respective interconnection levels 100, 200, 300, 400. In particular, the first multi-level via structure 10 extends downwards through the first dielectric layer 110 and abuts the first set of conductive paths 120, and extends upwards bypassing the second interconnection level 200 and abuts the third set of conductive paths 320. Similarly, the second multi-level via structure 20 extends downwards through the second dielectric layer 210 and abuts the second set of conductive paths 220, and extends upwards bypassing the third interconnection level 300 and abuts the fourth set of conductive paths 420.

Again, it is emphasized that the multi-level via structures are not necessarily configured to communicatively connect the conductive paths, but in contrast the multi-level via structures may be implemented in the interconnect structure 105 solely for their mechanical properties.

The first multi-level via structure 10 here extends further upwards than a lowermost end 22 of the second multi-level via structure 20. In other words, both the first multi-level via structure 10 and the second multi-level via structure 20 occupy a volume within the second interconnection level 200. Accordingly, the first multi-level via structure 10 here extends past an interface between the first interconnection level 100 and the second interconnection level 200. Similarly, the second multi-level via structure 20 here extends past an interface between the second interconnection level 200 and the third interconnection level 300. Hereby, a staggered overlapping arrangement is provided. Such an arrangement may reduce the risk of cracks and/or propagation of cracks horizontally within the second interconnection level 200, and in particular crack formation or delamination between the second dielectric layer 210 and the second set of conductive paths 220.

The interconnect structure 105 may include via-connection structures, e.g. conventional vias. The differences between the multi-level via structures of the present disclosure and conventional via-connection structures are clearly seen in FIG. 1; some via-connection structures 15 extend from the second interconnection level 200 to the third interconnection level 300, and other via structures 25 extend from the third interconnection level 300 to the fourth interconnection level 400, whereas the multi-level via structures 10, 20 extend over at least three interconnection levels (first to third or second to fourth).

Figure 2:
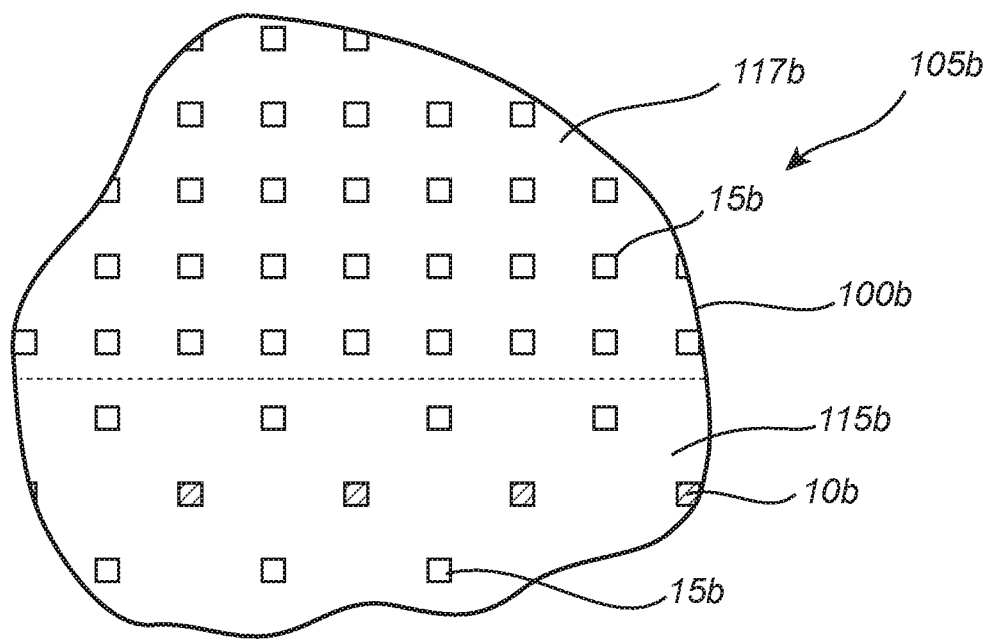
FIG. 2 is a schematic cross-sectional top view of an interconnect structure, according to example embodiments.

Referring now to FIG. 2, a cross-sectional top view of an interconnect structure 105b is illustrated. The illustrated cross-section shows via-connection structures 15b in a horizontal plane of an interconnection level 100b. The via-connection structures 15b are configured to electrically connect adjacent interconnection levels (downwards into and outwards from the illustrated cross section). A region 115b is illustrated having a density of via-connection structures below a predefined threshold, e.g. 5% or 2%. It should be noted that the illustrated via-connection structures are merely a schematic representation, and may not accurately portray e.g. a 5% or 2% density of via-connection structures. The region 115b having a relatively lower density of via-connection structures as compared to the region 117b may have more unfavorable mechanical properties increasing the risk of crack formation and/or delamination. Thus, the region 115b may benefit from the multi-level via structures 10b of the interconnect structure according to the disclosure.

Figure 3:
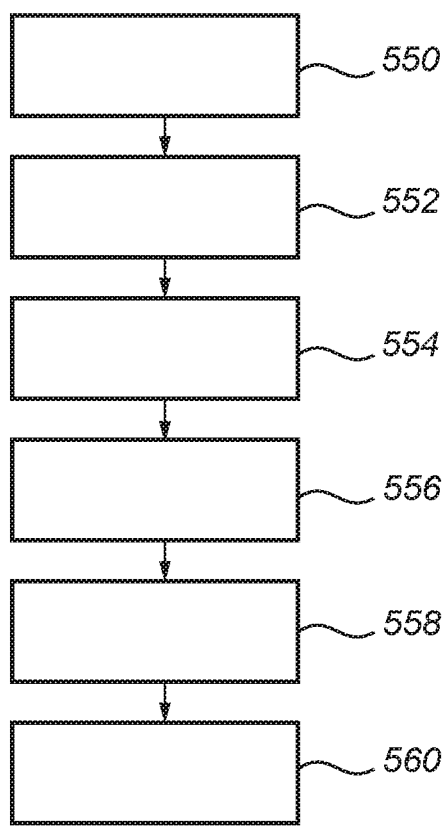
FIG. 3 is a flow chart diagram of a method of forming a first multi-level via structure and a second multi-level via structure in an interconnect structure, according to example embodiments.

A method of forming a first multi-level via structure and a second multi-level via structure in an interconnect structure according to the disclosure will now be described with reference to FIG. 3. For clarity and simplicity, the method will be described in terms of "steps." It is emphasized that steps are not necessarily processes that are delimited in time or separate from each other, and more than one "step" may be performed at the same time in a parallel fashion.

The method includes a step 550 of forming a first interconnection level including a first dielectric layer and a first set of conductive paths; a step 552 of forming a second interconnection level, including a second dielectric layer and a second set of conductive paths, above the first interconnection level; a step 554 of forming a third interconnection level, including a third dielectric layer and a third set of conductive paths, above the second interconnection level; a step 556 of forming a first multi-level via structure extending from the first interconnection level to the third interconnection level, wherein the first multi-level via structure is formed as a single unitary body passing through the second interconnection level distant from any of the second set of conductive paths; a step 558 of forming a fourth interconnection level, including a fourth dielectric layer and a fourth set of conductive paths, above the third interconnection level; and a step 560 of forming a second multi-level via structure extending from the second interconnection level to the fourth interconnection level, wherein the second multi-level via structure is formed as a single unitary body passing through the third interconnection level distant from any of the third set of conductive paths.

In the above the inventive concept has mainly been described with reference to a limited number of examples. However, as is readily appreciated by a person skilled in the art, other examples than the ones disclosed above are equally possible within the scope of the disclosure, as defined by the appended claims.

What is claimed is:

1. An interconnect structure, comprising:
    a first interconnection level including a first dielectric layer and a first set of conductive paths;
    a second interconnection level arranged above the first interconnection level and including a second dielectric layer and a second set of conductive paths;
    a third interconnection level arranged above the second interconnection level and including a third dielectric layer and a third set of conductive paths;
    a fourth interconnection level arranged above the third interconnection level and including a fourth dielectric layer and a fourth set of conductive paths;
    a first multi-level via structure extending from the first interconnection level to the third interconnection level and forming a single unitary body passing through the second interconnection level electrically bypassing any conductive paths within the second interconnection level; and
    a second multi-level via structure extending from the second interconnection level to the fourth interconnection level and forming a single unitary body passing through the third interconnection level electrically bypassing any conductive paths within the third interconnection level.

2. The interconnect structure according to claim 1,
    wherein the first interconnection level and the second interconnection level form part of a first group of layers,
    wherein the third interconnection level and the fourth interconnection level form part of a second group of layers, and
    wherein an effective out-of-plane elastic modulus of the first group of layers differs by at least 15% from an effective out-of-plane elastic modulus of the second group of layers.

3. The interconnect structure according to claim 1,
    wherein the first dielectric layer and the second dielectric layer are formed of a material having a dielectric constant below 3, and
    wherein the third dielectric layer and the fourth dielectric layer are formed of a material having a dielectric constant of 3 or more.

4. The interconnect structure according to claim 1,
    wherein the first dielectric layer and the second dielectric layer are formed of a material having a dielectric constant of 3 or more, and wherein the third dielectric layer and the fourth dielectric layer are formed of a material having a dielectric constant below 3.

5. The interconnect structure according to claim 1,
wherein the first dielectric layer and the second dielectric layer are formed of a silicon dioxide, and
wherein the third dielectric layer and the fourth dielectric layer are formed of a material having a dielectric constant below 3.

6. The interconnect structure according to claim 1,
wherein the first dielectric layer and the second dielectric layer are formed of a material having a dielectric constant below 3, and
wherein the third dielectric layer and the fourth dielectric layer are formed of a silicon dioxide.

7. The interconnect structure according to claim 1, further comprising a plurality of via-connection structures for electrically connecting adjacent interconnection levels of the first, second, third, and fourth interconnection levels, wherein the first multi-level via structure or the second multi-level via structure is arranged in a region in which a density of the via-connection structures is less than 5%.

8. The interconnect structure according to claim 1,
wherein the first multi-level via structure connects the first set of conductive paths to the third set of conductive paths, and
wherein the second multi-level via structure connects the second set of conductive paths to the fourth set of conductive paths.

9. A method of forming a first multi-level via structure and a second multi-level via structure in an interconnect structure, comprising:
forming a first interconnection level including a first dielectric layer and a first set of conductive paths;
forming a second interconnection level including a second dielectric layer and a second set of conductive paths, above the first interconnection level;
forming a third interconnection level including a third dielectric layer and a third set of conductive paths, above the second interconnection level;
forming a first multi-level via structure extending from the first interconnection level to the third interconnection level, wherein the first multi-level via structure is formed as a single unitary body passing through the second interconnection level distant from any of the second set of conductive paths;
forming a fourth interconnection level including a fourth dielectric layer and a fourth set of conductive paths, above the third interconnection level; and
forming a second multi-level via structure extending from the second interconnection level to the fourth interconnection level, wherein the second multi-level via structure is formed as a single unitary body passing through the third interconnection level distant from any of the third set of conductive paths.

10. The method according to claim 9,
wherein the first multi-level via structure connects the first set of conductive paths to the third set of conductive paths, and
wherein the second multi-level via structure connects the second set of conductive paths to the fourth set of conductive paths.

11. A method of improving resistance to crack propagation in a semiconductor device using an interconnect structure, wherein the interconnect structure comprises:
a first interconnection level including a first dielectric layer and a first set of conductive paths;
a second interconnection level arranged above the first interconnection level and including a second dielectric layer and a second set of conductive paths;
a third interconnection level arranged above the second interconnection level and including a third dielectric layer and a third set of conductive paths;
a fourth interconnection level arranged above the third interconnection level and including a fourth dielectric layer and a fourth set of conductive paths;
a first multi-level via structure extending from the first interconnection level to the third interconnection level and forming a single unitary body passing through the second interconnection level electrically bypassing any conductive paths within the second interconnection level; and
a second multi-level via structure extending from the second interconnection level to the fourth interconnection level and forming a single unitary body passing through the third interconnection level electrically bypassing any conductive paths within the third interconnection level.

12. The method according to claim 11,
wherein the first interconnection level and the second interconnection level form part of a first group of layers,
wherein the third interconnection level and the fourth interconnection level form part of a second group of layers, and
wherein an effective out-of-plane elastic modulus of the first group of layers differs by at least 15% from an effective out-of-plane elastic modulus of the second group of layers.

13. The method according to claim 11,
wherein the first dielectric layer and the second dielectric layer are formed of a material having a dielectric constant below 3, and
wherein the third dielectric layer and the fourth dielectric layer are formed of a material having a dielectric constant of 3 or more.

14. The method according to claim 11,
wherein the first dielectric layer and the second dielectric layer are formed of a material having a dielectric constant of 3 or more, and
wherein the third dielectric layer and the fourth dielectric layer are formed of a material having a dielectric constant below 3.

15. The method according to claim 11,
wherein the first dielectric layer and the second dielectric layer are formed of a silicon dioxide, and
wherein the third dielectric layer and the fourth dielectric layer are formed of a material having a dielectric constant below 3.

16. The method according to claim 11,
wherein the first dielectric layer and the second dielectric layer are formed of a material having a dielectric constant below 3, and
wherein the third dielectric layer and the fourth dielectric layer are formed of a silicon dioxide.

17. The method according to claim 11, further comprising a plurality of via-connection structures for electrically connecting adjacent interconnection levels of the first, second, third, and fourth interconnection levels, wherein the first multi-level via structure or the second multi-level via structure is arranged in a region in which a density of the via-connection structures is less than 5%.

18. The method according to claim 11,
wherein the first multi-level via structure connects the first set of conductive paths to the third set of conductive paths, and
wherein the second multi-level via structure connects the second set of conductive paths to the fourth set of conductive paths.

* * * * *